(12) United States Patent
Qin et al.

(10) Patent No.: US 11,245,066 B2
(45) Date of Patent: Feb. 8, 2022

(54) SHEAR VIBRATION-BASED PIEZOELECTRIC COMPOSITE MATERIAL AND PREPARATION METHOD THEREOF

(71) Applicant: Beijing Information Science & Technology University, Beijing (CN)

(72) Inventors: Lei Qin, Beijing (CN); Junbo Jia, Beijing (CN); Likun Wang, Beijing (CN)

(73) Assignee: Beijing information Science & Technology University, Beijing (CN)

( * ) Notice: Subject to any disclaimer, the term of this patent is extended or adjusted under 35 U.S.C. 154(b) by 414 days.

(21) Appl. No.: 16/331,620

(22) PCT Filed: Mar. 3, 2017

(86) PCT No.: PCT/CN2017/075575
§ 371 (c)(1),
(2) Date: Mar. 8, 2019

(87) PCT Pub. No.: WO2018/145340
PCT Pub. Date: Aug. 16, 2018

(65) Prior Publication Data
US 2019/0386200 A1    Dec. 19, 2019

(30) Foreign Application Priority Data
Feb. 13, 2017 (CN) .......................... 201710075924.1

(51) Int. Cl.
*H01L 41/257* (2013.01)
*H01L 41/27* (2013.01)
*H01L 41/18* (2006.01)

(52) U.S. Cl.
CPC .......... *H01L 41/257* (2013.01); *H01L 41/183* (2013.01); *H01L 41/27* (2013.01)

(58) Field of Classification Search
CPC ...... H01L 41/27; H01L 41/183; H01L 41/257
See application file for complete search history.

(56) References Cited

U.S. PATENT DOCUMENTS 5,422,532 A    6/1995   Inoue et al.

FOREIGN PATENT DOCUMENTS

| CN | 1356773 A | 7/2002 |
|----|-----------|--------|
| CN | 103076402 A | 5/2013 |

(Continued)

*Primary Examiner* — Shawki S Ismail
*Assistant Examiner* — Monica Mata
(74) *Attorney, Agent, or Firm* — SV Patent Service

(57) ABSTRACT

A shear vibration-based piezoelectric composite material and a preparation method thereof are disclosed. The piezoelectric composite material includes a piezoelectric material and the passive material. The piezoelectric material includes a piezoelectric material polarized along the x-axis positive and a piezoelectric material negatively polarized along the x-axis. The piezoelectric materials in the two polarization directions are alternately arranged along the x-axis direction. The passive material includes a filling layer, a transition layer, and a planar layer. The filling layer is disposed between every two adjacent piezoelectric materials. The planar layer is located outer two surfaces perpendicular to the z-axis of the piezoelectric material. The planar layer on one side is fixedly connected to the filling layer in the odd-numbered position via the transition layer. The planar layer on the other side is fixedly connected to the filling layer in the even-numbered position via the transition layer. The piezoelectric composite material can be used to prepare an underwater acoustic transducer, a hydrophone, piezoelectric energy harvesters, and the like. The invention innovatively converts shear vibrations into the thickness vibrations of the upper and lower surfaces of the composite material, thereby improving the performance of the composite material.

13 Claims, 7 Drawing Sheets

(56) References Cited

FOREIGN PATENT DOCUMENTS

| | | |
|---|---|---|
| CN | 103134999 A | 6/2013 |
| CN | 105047811 A | 11/2015 |

SHEAR VIBRATION-BASED PIEZOELECTRIC COMPOSITE MATERIAL AND PREPARATION METHOD THEREOF

TECHNICAL FIELD

The invention relates to the technical field of piezoelectric materials, and in particular, relates to a piezoelectric composite material based on shear vibrations and a preparation method thereof.

BACKGROUND OF THE INVENTION

Since the Curie brothers discovered piezoelectricity in quartz in 1880, researchers have been working to increase the piezoelectric constant of piezoelectric materials and their electromechanical coupling coefficients to improve the energy conversion efficiency of the transducers. At present, piezoelectric materials are mainly classified into piezoelectric ceramics, piezoelectric single crystals, piezoelectric composite materials, and piezoelectric polymers. Because of their different characteristics, these materials have found different applications in the fields of underwater sound, ultrasound, and sensing.

Piezoelectric composite materials have appeared in the past forty years. It is composed of a piezoelectric material and a polymer. It mainly improves the overall properties of the material by adding a polymer phase. Since the concept of connectivity was proposed by Newnham et al. at Pennsylvania State University in 1978, piezoelectric composites have grown considerably. From that time, piezoelectric composites have entered a period of rapid development. Newnham, Skinner, Klicker, Gururaja, and Savakus conducted a large number of theoretical and experimental studies, and developed various types of 0-3, 2-2, 1-3, 3-1, and 3-2 structural piezoelectric composites. Chinese researchers have also conducted related research. Researchers are more inclined to use 1-3 piezoelectric composites due to factors such as integrated manufacturing processes, cost of mass production, and material properties. It has the characteristics of simple preparation process, strong piezoelectricity and large electromechanical coupling coefficient than other types of piezoelectric composite materials. The 1-3 type piezoelectric composite material is characterized in that the piezoelectric ceramic columns or the single crystal columns are connected in the thickness direction only, and the polymer phase such as epoxy resin poured around the columns are connected three-dimensionally. At this time, the researchers realized that the vibration mode of the ceramic inside the composite affects the performance of the composite as the main factor. 1-3 piezoelectric composites improve performance by converting the thickness vibration of a monolithic ceramic into longitudinally stretching vibrations (also known as $d_{33}$ modes) of many piezoelectric columns. For piezoelectric ceramic materials, the electromechanical coupling coefficient $k_t$ for thickness vibration is about 0.5, while the electromechanical coupling factor $k_{33}$ for longitudinal stretching is up to 0.7. Therefore, by changing the vibration mode of the crystal column, the equivalent thickness electromechanical coupling coefficient of the 1-3 type composite material can be increased by about 20% compared with the coefficient of piezoelectric ceramic.

So far, the research on 1-3 piezoelectric composite materials has entered a heyday, and at the same time it has run into a bottleneck for continued development. In summary, no matter which research method is adopted, it is based on the $d_{33}$ mode of piezoelectric materials. Theory and the preparation process of the 1-3 piezoelectric composites are already quite mature. Thickness electromechanical coupling coefficient of composite has reached up to about 0.89, which cannot provide much room for improvement toward the theoretical maximum of 0.93. The maximum value of the piezoelectric constant $k_{33}$ can reach about 2000, which is very close to the $d_{33}$ of the relaxed ferroelectric single crystal. Therefore, in order to further improve the piezoelectricity and electromechanical coupling coefficient of composite materials, it is only possible to use other vibration modes. In the $d_{15}$ shear vibration mode, when the electric excitation is applied in one direction (non-polarization direction) of the piezoelectric ceramic material, the vibration state is deformed in the tangential direction of the other two directions. For piezoelectric ceramics, the piezoelectric constant $d_{15}$ is generally larger than $d_{33}$ and $d_{31}$. For a relaxed ferroelectric single crystal, the magnitude of $d_{15}$ has a large dependence on the crystal orientation and different materials. For piezoelectric ceramic materials, $k_{15}$ is not significantly lower than $k_{33}$, especially for PZT-5A piezoelectric ceramics, and $k_{15}$ is also significantly higher than $k_{33}$. For a relaxed ferroelectric single crystal, the magnitude of $d_{15}$ has a large relationship with the crystal orientations and material. Therefore, the $d_{15}$ mode of shear vibration is much better than the longitudinally stretched $d_{33}$ mode. However, there are few studies on the piezoelectric material $d_{15}$ mode worldwide, mainly in the field of energy harvesting. Because it produces shear deformation, it is more difficult to produce plane waves, so it is rare to use it as a conventional transducer.

In addition, this composite material is also suitable for use in the field of energy harvesting. Because it selects a vibration mode with higher energy conversion efficiency, the composite material can be externally stressed and transmitted to the piezoelectric element through a transition structure, thereby generating a stress amplification effect, further increasing the voltage of the output electrical signal, thereby making it more sensitive.

SUMMARY OF THE INVENTION

In order to overcome the limitation of the $d_{33}$ mode of the conventional piezoelectric composite application, the present invention provides a piezoelectric composite material based on shear vibration ($d_{15}$ mode) and a preparation method thereof, which innovatively select higher piezoelectric constants and electromechanical coupling coefficient of the $d_{15}$ mode for preparing a piezoelectric composite material. At the same time, the weak point of the shear vibration caused by the $d_{15}$ mode is overcome by a special structural design that transforms shears into thickness vibrations of the upper and the lower surfaces of the composite material.

The technical solution adopted by the present invention is as follows:

A shear vibration-based piezoelectric composite includes a piezoelectric material and a passive material. The piezoelectric material includes a first piezoelectric material polarized along a positive x-axis direction and a second piezoelectric material polarized along a negative x-axis direction, wherein polarization directions of the first piezoelectric material and the second piezoelectric material are alternately arranged along the x-axis direction. The passive material includes a filling layer, a transition layer and a planar layer, wherein the filling layer is disposed between every two of the first piezoelectric material and the second piezoelectric material that are adjacent to each other. The planar layer can be located outside two surfaces of the piezoelectric material that are perpendicular to z-axis. One side of the planar layer is fixedly connected to the filling layer at odd-numbered positions through the transition layer, and another side of the planar layer is fixedly connected to the fill layer at the eve-numbered positions through the transition layer.

Furthermore, the shear vibration-based piezoelectric composite further includes electrodes disposed on the two surfaces of the piezoelectric material perpendicular to the z-axis.

Furthermore, when the composite material is in operation, the angle between the polarization directions and direction of an electric field is about 90 degrees. The piezoelectric material can generate shear deformations in response to excitation of the electric field and to drive vibrations in the filling layers between the first piezoelectric material and the second piezoelectric material. The vibrations generated in adjacent filling layers are in opposite directions. The vibrations in the filling layers can be transmitted to the planar layer through the transition layer, which transforms shear vibrations in the piezoelectric material to thickness vibrations in the transition layer.

Furthermore, the composite material structure can include a pre-stressing structure configured to apply a pre-stress to the piezoelectric material along the x-axis direction to increase compressive and tensile strength.

Furthermore, the piezoelectric material can include a piezoelectric ceramic, a piezoelectric single crystal, a piezoelectric polymer, a piezoelectric composite material, or the like.

Furthermore, the passive material can include a polymer, a metal, or a ceramic. The polymer can include an epoxy resin, a phenol resin, polyurethane, a rubber, or a plexiglass, or the like. When used as an energy harvesting device, there is no need for impedance matching with water, but a more robust structure is required, in which case metal or ceramic materials may be more suitable.

Furthermore, the transition layer can have a trapezoidal, a rectangular, or a parabolic cross section, or the like. The transition layer can have a cylindrical or conical shape, or the like.

Furthermore, the planar layers may be joined together to form a plane, or may be independent of each other (i.e., the polymer planar layers connected to the transition layers at different positions are independent of each other, not integrated).

A method for preparing the above piezoelectric shear-vibration-based composite material, comprising the following steps:

1) cutting a piezoelectric material into a plurality of blocks arranged in an array;

2) sputtering electrodes on two opposite surfaces of each of the plurality of blocks of the piezoelectric material;

3) forming a filling layer, a transition layer, and a planar layer by machining; and 4) bonding the filling layer, the transition layer, and the planar layer to the plurality of blocks of the piezoelectric material, and welding wire to the electrodes to form a piezoelectric composite material.

The method for preparing the above piezoelectric shear-vibration-based composite material, can further include:

1) pasting a mask material on a first surface of the piezoelectric material;

2) cutting the piezoelectric material in a direction perpendicular to the first surface to form the plurality of blocks arranged in the array;

3) sputtering electrodes on the first surface and cut surfaces of each of the plurality of blocks;

4) building a mold according to shapes of the filling layer, the transition layer, and the plane layer; and placing the mold next to each of the plurality of blocks;

5) injecting a polymer material with the mold and curing to form a filling layer, a transition layer, and a planar layer made of the polymer material on a side of the first surface of the piezoelectric material;

6) repeating steps 1) to 5) on a second surface of the piezoelectric material opposite to the first surface to form a filled layer, a transition layer, and a planar layer on a side of the second surface of the piezoelectric material; and 7) removing mold and mask materials by temperature shock method to form the piezoelectric composite material.

A hydro-acoustic transducer includes a piezoelectric composite vibrator comprising the shear vibration-based piezoelectric composite, a waterproof sound-permeable layer, and an output cable, wherein the shear vibration-based piezoelectric composite is connected to the output cable through a lead wire, wherein the piezoelectric composite vibrator is sealed outside by the waterproof sound-permeable layer.

An energy collecting device (hydrophone or piezoelectric energy harvester) includes a piezoelectric composite vibrator comprising a shear vibration-based piezoelectric composite, a clamp structure configured to increase compressive tensile strength, a waterproof sound-permeable layer, and an output cables, wherein the shear vibration-based piezoelectric composite is connected to the output cable by a lead wire, wherein the piezoelectric composite vibrator is sealed outside by the waterproof sound-permeable layer.

The beneficial effects of the present invention are as follows:

The presently disclosed shear-vibration-based composite material overcomes the weak point of shear vibrations generated by the $d_{15}$ mode, and transforms shear vibrations into thickness vibrations on the upper and lower surfaces of the composite material through special structural design, thereby improving the performance of the composite material. It has a high electromechanical coupling coefficient and a high piezoelectric constant and can be used to prepare a high-power underwater acoustic transducer array. The disclosed device and methods break through the limitation of the $d_{33}$ mode in the traditional 1-3 type piezoelectric composite material, and makes the $d_{15}$ mode possible in the transducer vibrator, which represents a new idea for the vibrator structures. In the defense field, the shear-vibration-based composite material can improve the working distance and the detection accuracy of the sonar system. In the civilian field, the shear-vibration-based composite material can improve the detection accuracy of ultrasonic non-destructive testing and medical ultrasound.

DETAILED DESCRIPTION OF IMPLEMENTATIONS

The technical content of the present invention will be further described in detail with reference to the accompanying drawings.

1. Structure of Piezoelectric Composite Based on Shear Vibration

Figure 1:
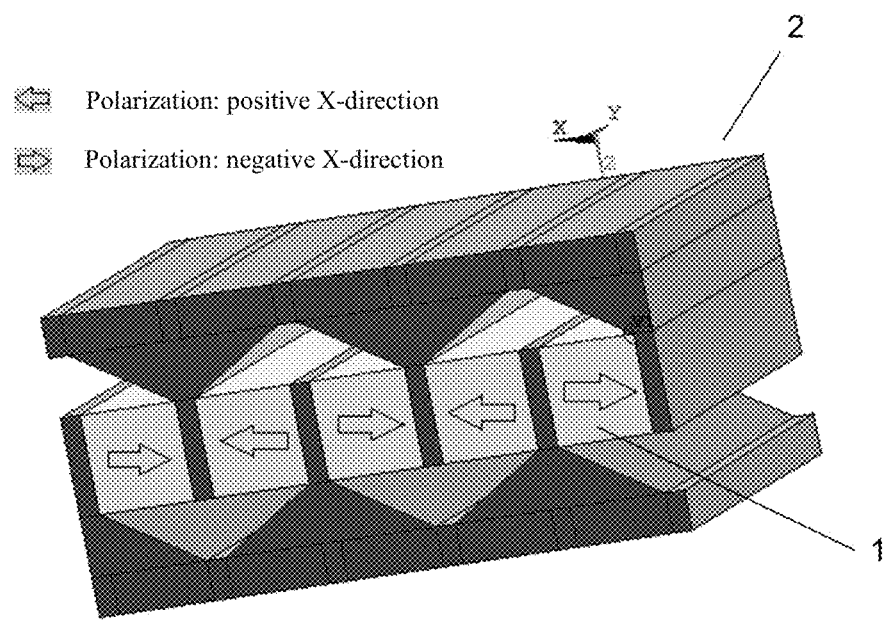
FIG. 1 is a schematic view showing an exemplified structure of a shear-vibration-based piezoelectric composite in accordance to some embodiments of the present invention.

The structure of the shear vibration-based piezoelectric composite is composed of an active material, that is, a piezoelectric material, and a passive material, that is, a non-piezoelectric material. As shown in FIG. 1, the exemplified composite material is composed of piezoelectric ceramic material 1 and a polymer material 2. The piezoelectric ceramic materials positively polarized along the x axis and the piezoelectric ceramic materials negatively polarized along the x-axis are alternately arranged in an array. The polymer material (e.g. epoxy resin) is extruded between the piezoelectric ceramic materials. Electrodes are prepared on two ceramic faces perpendicular to the z-axis.

Figure 2:
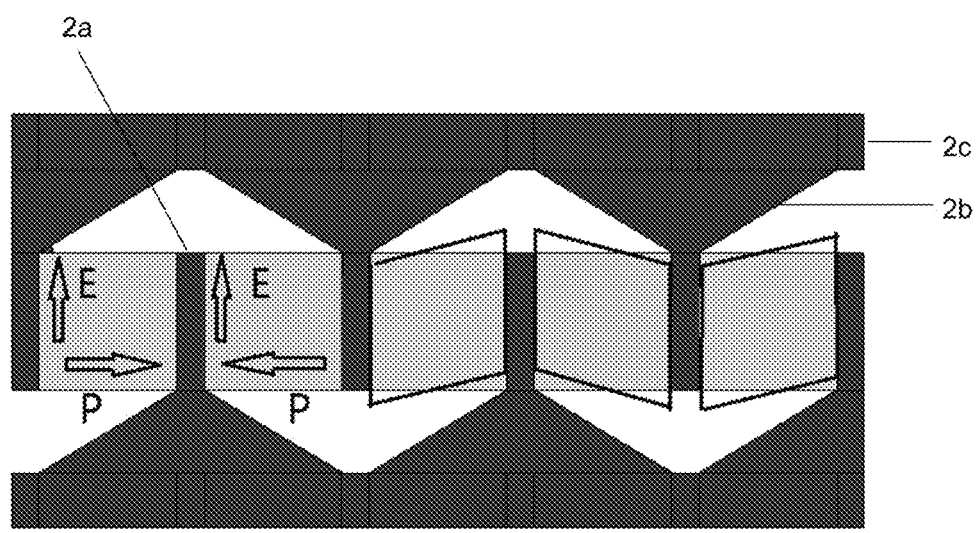
FIG. 2 is a schematic view showing the polarization directions and the vibration mode of the shear-vibration-based piezoelectric composite.

FIG. 2 shows a schematic view of the polarization directions and the vibration mode of the shear-vibration-based piezoelectric composite. Since the angle between the polarization direction and the electric field direction is 90 degrees, the $d_{15}$ vibration mode of the piezoelectric ceramic is excited. The $d_{15}$ vibration mode refers to shear deformations that occur in the x-z plane of a piezoelectric ceramic material when it is applied with a polarization in the x direction (positive or negative x direction) and an electric excitation in the z direction (i.e., perpendicular to polarization direction). As shown in FIG. 2, the first and second ceramic blocks represent the polarization direction P and the electric field direction E in the ceramic material. The third, the fourth, and the fifth ceramic blocks illustrate deformations of the ceramic material under the electric field excitation. It can be seen that the third and fourth two ceramic blocks work together to drive the polymer 2a (polymer filled layer) phase between the two blocks to vibrate. The fourth and fifth ceramic blocks work together to drive the polymer to produce the opposite vibration. This vibrations are then transmitted to the polymer plane 2c (the polymer planar layer) of the upper and lower surfaces through the trapezoidal polymer phase 2b (the polymer transition layer), thereby accomplishing electromechanical conversions and realizing the transformation from piezoelectric shear vibrations to thickness vibrations in composite material.

In other embodiments, the piezoelectric material may be a piezoelectric single crystal, a piezoelectric polymer, a piezoelectric composite, or the like, in addition to the piezoelectric ceramic.

In other embodiments, the polymer may be a phenolic resin, polyurethane, a rubber, a plexiglass, or a metal, ceramic, or the like, in addition to the epoxy resin.

In other embodiments, the cross section of the transition layer may be rectangular, parabolic, or the like, in addition to trapezoid. The overall shape of the transition layer may be cylindrical, conical, or the like.

Figure 10:
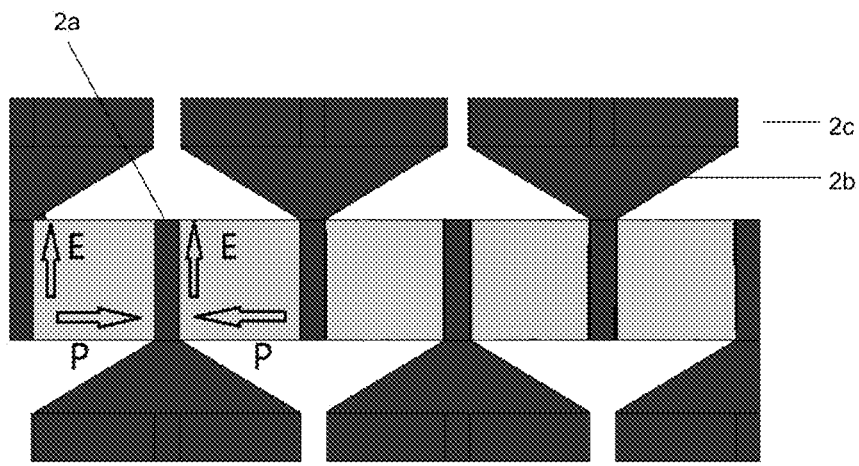
FIG. 10 is a schematic diagram showing a transition layers independent of each other and not joined by a planar layer.

In some embodiments, the transition layers may be joined together by a polymer planar layer (the polymer planar layers are joined together to form a plane), as shown in FIGS. 1 and 2. In other embodiments, the transition layers may be independent of each other, and are not connected together by a planar layer (buffer layer plane of the polymer attached to the polymer layers of different positions independently of each other, not as a single entity), as shown in FIG. 10.

2. Preparation Process Shear-Vibration-Based Piezoelectric Composite

Figure 3:
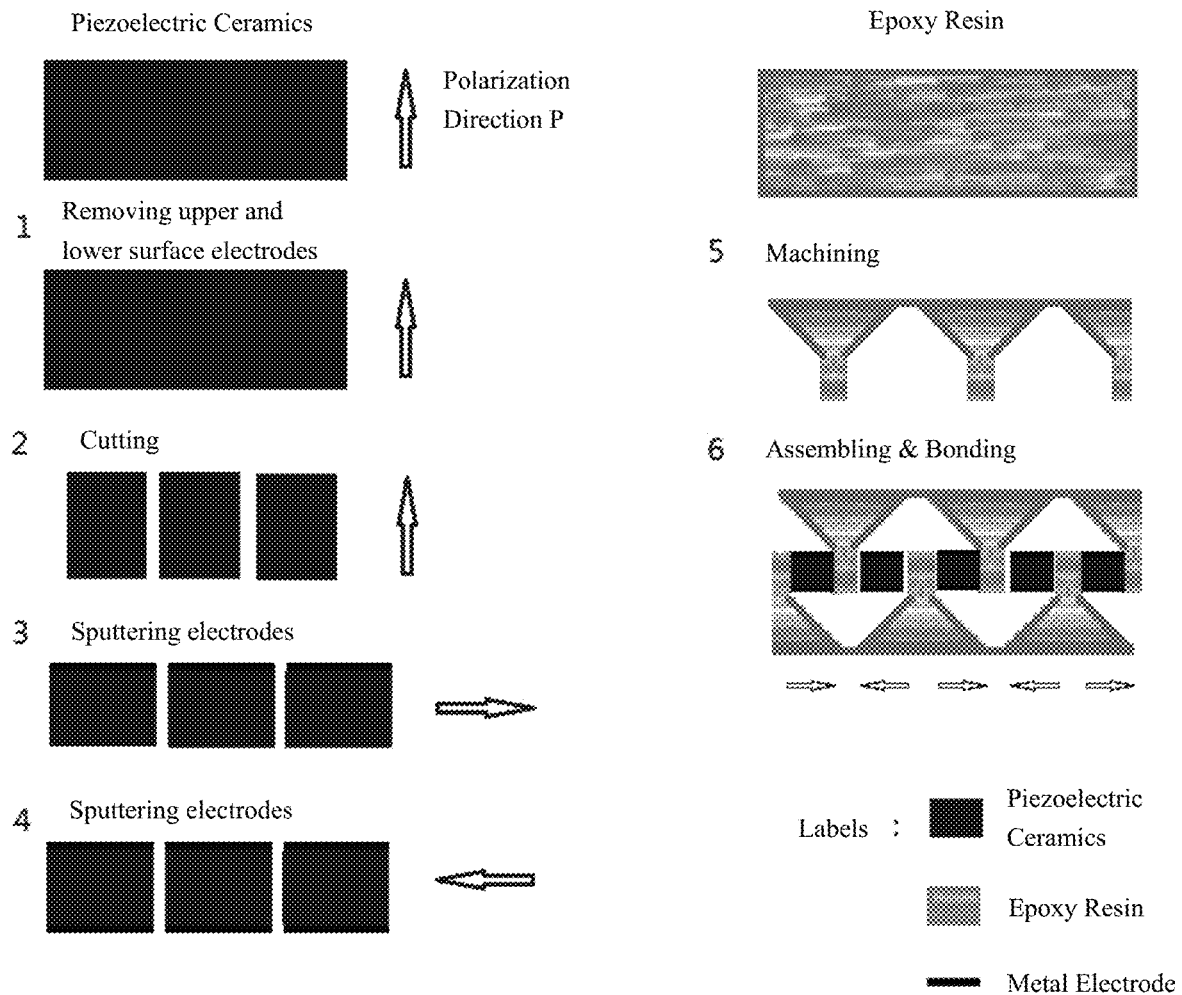
FIG. 3 is a flowchart of a preparation method for a shear-vibration-based piezoelectric composite in accordance to some embodiments of the present invention.

The above-mentioned shear-vibration-based piezoelectric composite can be formed by two-phase compound materials. The preparation process of the composite material has an influence on its performance. Two exemplified preparation processes for composite material are described below:

In the first method, the composite material is prepared by a preparation process shown in FIG. 3, including the following steps:

1) taking a complete piezoelectric ceramic block and removing the upper and lower surface electrodes using sandpaper or precision grinding machine;

2) after the surface electrode are removed, performing precision cutting the piezoelectric ceramic block from in the Z direction according to the design sizes, and cutting the piezoelectric ceramic into a plurality of piezoelectric ceramic blocks;

3) laying down the piezoelectric ceramic blocks and placing them in a vacuum sputtering apparatus to sputter electrodes;

4) rotating the piezoelectric ceramic blocks to an opposite direction, sputtering electrodes on the opposite side of the piezoelectric ceramic blocks;

5) machining an epoxy block into a structure as shown;

6) bonding the machined epoxy resin block and the piezoelectric ceramic as shown, and finally welding wire to electrodes to form a piezoelectric composite material.

Figure 4:
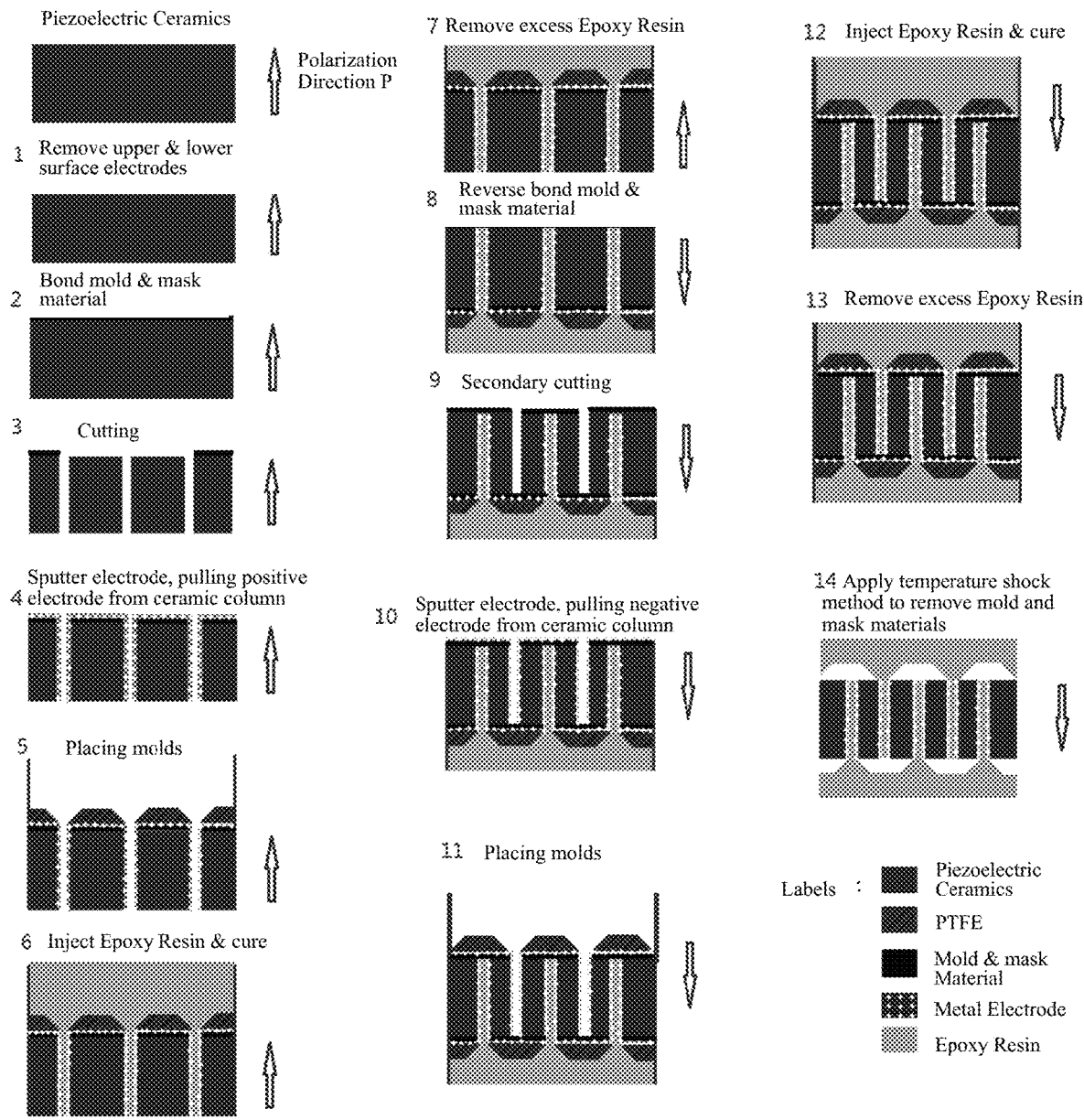
FIG. 4 is a flowchart of another preparation method for a shear-vibration-based piezoelectric composite in accordance to some embodiments of the present invention.

In the second method, the composite material is prepared by the preparation process shown in FIG. 4, including the following steps:

1) taking a complete piezoelectric ceramic block and removing the upper and lower surface electrodes using sandpaper or precision grinding machine;

2) bonding a mask material on the surface of an original electrode;

3) performing precision cutting the piezoelectric ceramic block from in the Z direction according to the design sizes, and cutting the piezoelectric ceramic into a plurality of piezoelectric ceramic blocks;

4) placing the piezoelectric ceramic blocks in a vacuum to sputter electrodes and withdrawing a positive electrode from the ceramic columns along the positive z axis;

5) placing a pre-designed trapezoidal and boundary molds in the correct positions;

6) injecting a prepared 618 epoxy resin and waiting for 12 hours for it to fully cure;

7) using sandpaper or a precision grinder to remove the excess epoxy resin;

8) placing the semi-finished product in reverse and bonding the mask material;

9) performing secondary precision cutting along the Z direction according to the design size;

10) placing the piezoelectric ceramic blocks in a vacuum to sputter electrodes, and withdrawing a negative electrode from the ceramic column in the negative direction along the z axis;

11) placing pre-designed trapezoidal and boundary molds in the correct positions on the reverse side;

12) injecting a prepared 618 epoxy resin and waiting for 12 hours for it to fully cure;

13) sandpaper or a precision grinder to remove the excess epoxy resin;

14) finally, applying temperature shock method to remove the mold and the mask materials to form a piezoelectric composite material.

In the above preparation process, the polymer planar layer, the trapezoidal polymer transition layer, and the polymer filled layer can be molded simultaneously, or formed separately first and then bonded together. The trapezoidal transition layer and the planar layer can be selected from materials such as lightweight aluminum sheets and Plexiglas. The polymer trapezoidal transition layer and the planar layer may be integrally connected as needed or may be kept separate from each other.

3. Experimental Verification and Performance Analysis of Shear-Vibration-Based Piezoelectric Composites Studies have been conducted on the shear-vibration-based piezoelectric composite materials prepared as described above. Piezoelectric ceramic columns with length, width and height of 20 mm, 5 mm and 5 mm were prepared using PZT-4 and PZT-5H piezoelectric ceramics. The piezoelectric ceramics were polarized in the width direction and the electric field direction was in the thickness direction. The electrical conductance and electrical impedance curves of the piezoelectric ceramic $d_{15}$ mode can be measured by using an impedance analyzer. The experimental results show that the series resonant frequencies of PZT-5H and PZT-4 piezoelectric ceramics are 217 kHz and 244 kHz, respectively, and the parallel resonant frequencies are 263 kHz and 279 kHz, respectively. From the above results, the electromechanical coupling coefficients can be calculated to be 0.56 and 0.48, respectively. The electromechanical coupling coefficients are lower than the theoretical value because the shear vibration is not simple enough to couple the vibration in the longitudinal direction. The coupling of vibration can be avoided by adjusting the length dimension to increase the electromechanical coupling coefficient.

In order to verify the vibration mode at the resonant frequency, a laser Doppler vibration measuring instrument is used to measure the above two samples. The measurement results show that the piezoelectric ceramic vibration is shear vibration. When the piezoelectric ceramic has a polarization direction in the x direction and the electric field direction in the z direction, the shear vibration of the piezoelectric ceramic occurs in the x-z plane. Since the piezoelectric ceramic has a longer dimension in the y direction, the fundamental frequency along the length direction and the shear vibration are coupled at the resonance frequency. If it is not necessary to expand the bandwidth by vibration coupling, a 2-2 type composite structure can be introduced in the length direction to avoid vibration coupling.

Figure 5:
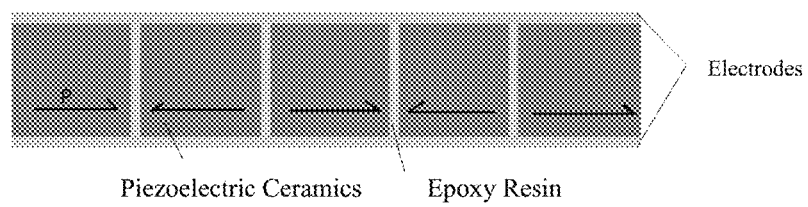
FIG. 5 is a schematic view showing the structure of a 2-2 type shear-vibration-based ceramic piezoelectric composite.

In order to verify the validity of the disclosed piezoelectric composite structure, shear-based a 2-2 type vibration structure is designed. As shown in FIG. 5, the adjacent piezoelectric ceramics have opposite polarization directions. The piezoelectric ceramics are filled with an epoxy resin. The upper and lower surfaces are sputtered with electrodes. Thereby the composite material is excited to produce shear vibrations. This structure differs from the above described invention piezoelectric composite in that no epoxy transition layer is introduced, shear vibrations are not converted into thickness vibrations for the time being and shear vibrations are excited only to verify the structure. Similarly, the piezoelectric ceramic columns in the composite have length, width, and height of 20 mm, 5 mm and 5 mm, respectively. The epoxy resin has a width of 1 mm.

Figure 6:
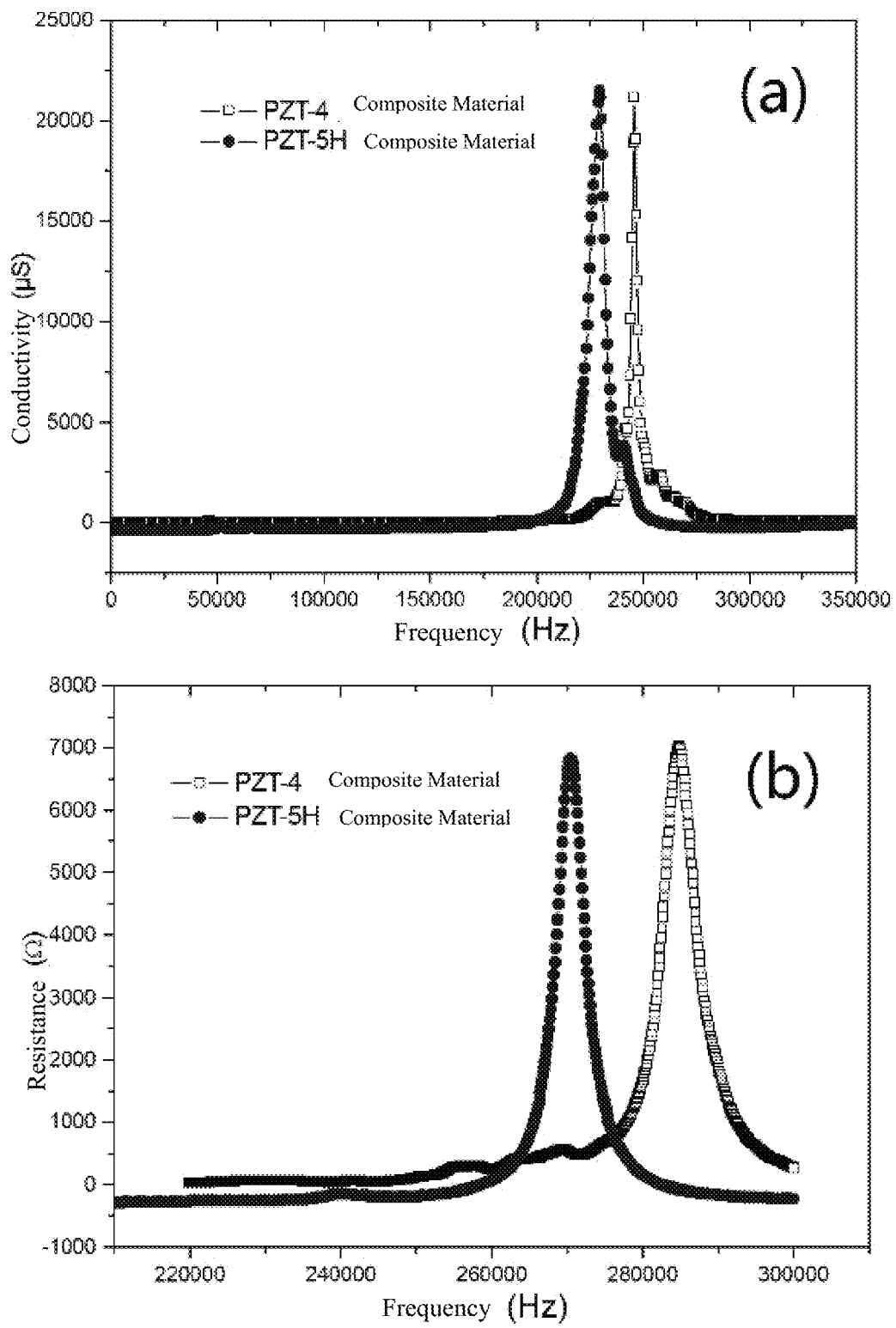
FIG. 6 shows conductivity and resistance of a shear-vibration-based piezoelectric composite, wherein (a) is a plot of conductivity G versus frequency and (b) is a plot of resistance R versus frequency.

It can be seen from the measurement results shown in FIG. 6 that the series resonant frequencies of PZT-5H and PZT-4 piezoelectric composites are 229 kHz and 245 kHz, respectively, and the parallel resonant frequencies are 270 kHz and 284 kHz, respectively. The electromechanical coupling coefficients are 0.53 and 0.51, respectively. For the PZT-5H piezoelectric composite, the electromechanical coupling coefficient is reduced from 0.56 to 0.53 for pure ceramics. This is because the introduction of epoxy resin increases the load and therefore reduces the electromechanical coupling coefficient. For the PZT-4 piezoelectric composite, the electromechanical coupling coefficient increases from 0.48 to 0.51 for pure ceramics. This is because the vibration mode of pure ceramics is not pure, so the electromechanical coupling coefficient is not the coefficient of the simple shear vibration mode. The theoretical value should be higher. After the composite material is prepared, the interference vibration mode is suppressed due to the presence of the epoxy resin, which makes the shear vibrations more pure, so that the electromechanical coupling coefficient is increased.

Figure 7:
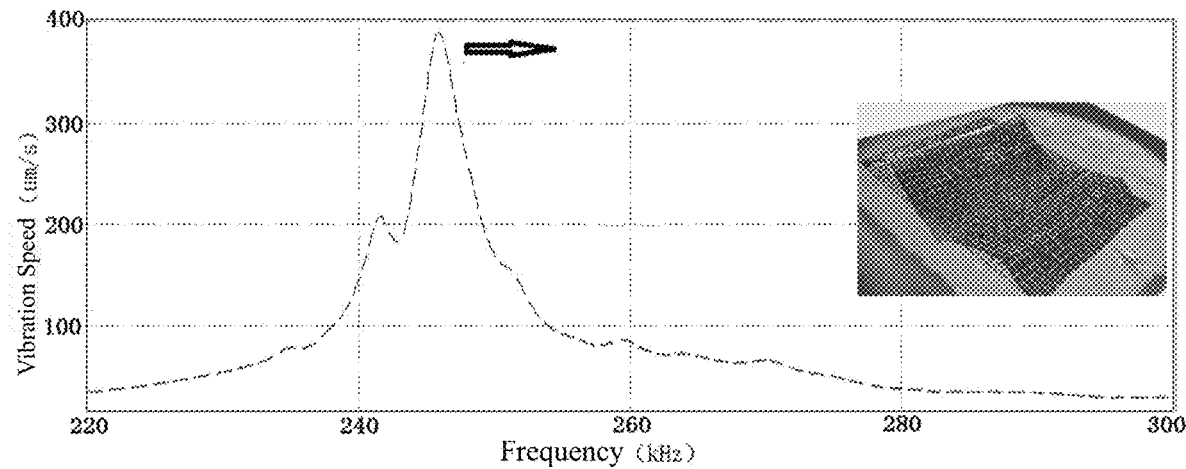
FIG. 7 is a vibration mode diagram of a PZT-4 shear-vibration-based piezoelectric composite.
Figure 8:
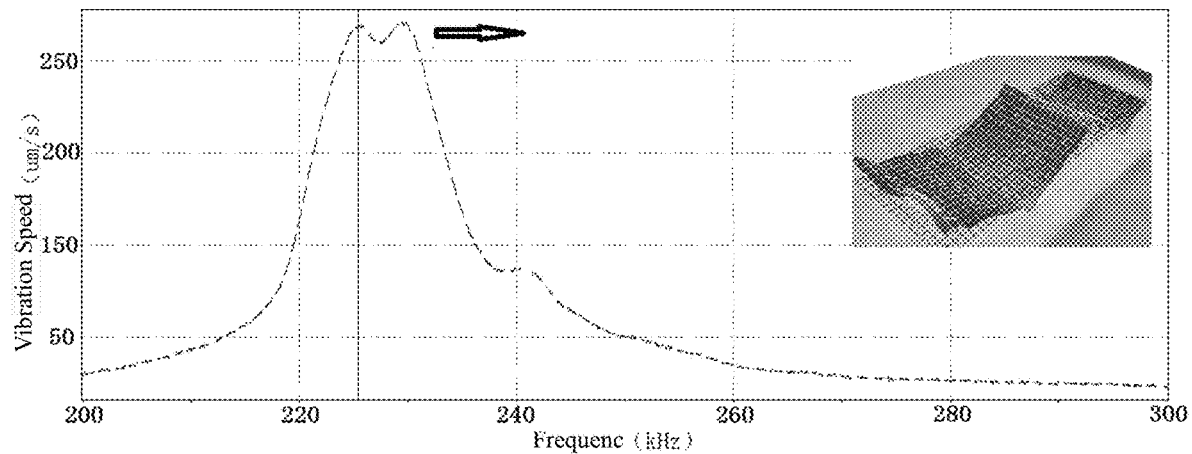
FIG. 8 is a vibration mode diagram of a PZT-5H shear-vibration-based piezoelectric composite.

FIGS. 7 and 8 respectively show the vibration velocity spectrum and vibration modes of the PZT-5H and PZT-4 piezoelectric composites. The peak of each curve corresponds to a certain vibration mode of the corresponding piezoelectric ceramic, while an insert show the surface topography of the sample at the maximum vibration velocity. By observing the characteristics of the surface morphology, the vibration modes of samples at the time can be summarized here. It can be seen that driven by the shear vibrations of the piezoelectric ceramic element, peaks and troughs alternately appear in the epoxy resin. The vibrations of the peaks are directed through the transition layer to the upper surface of the composite material shown in FIG. 2. The vibrations of the troughs are directed to the lower surface of the composite, thus the disclosed shear-vibration-based piezoelectric composite produce the desired results. Therefore, the feasibility of the presently disclosed novel shear-vibration-based piezoelectric composite is confirmed by the above experiment.

Figure 9A:
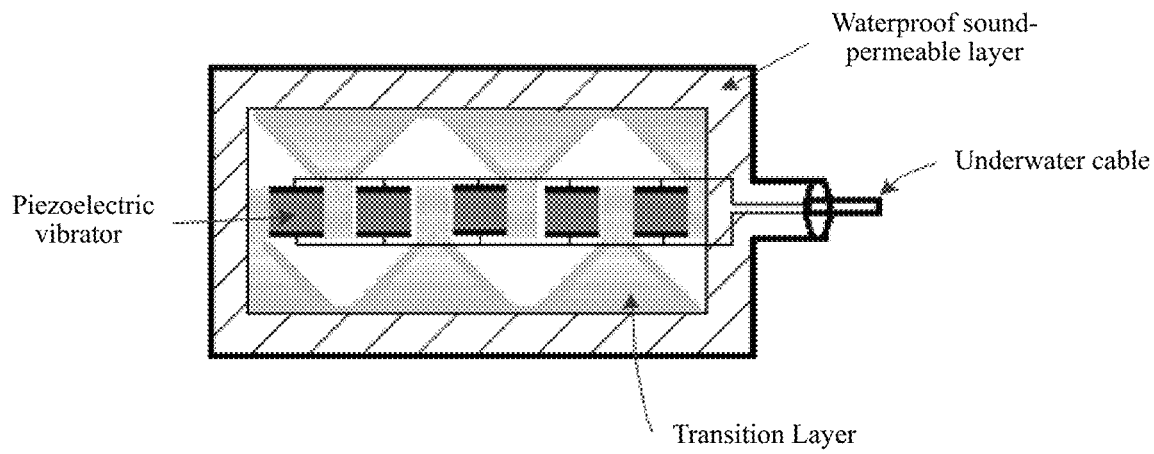
FIGS. 9A and 9B are diagrams showing configurations of underwater acoustic transducers made of a shear-vibration-based piezoelectric composite.
Figure 9B:
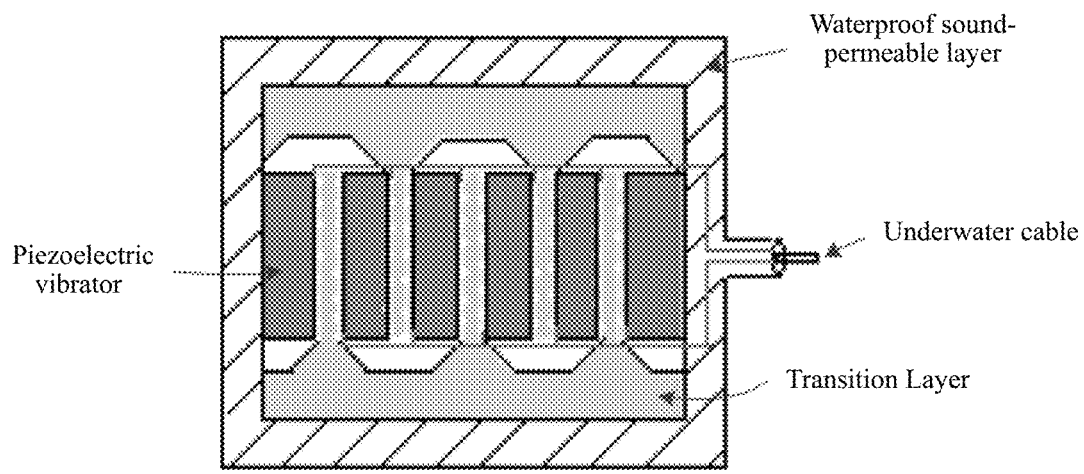

4. An Underwater Acoustic Transducer Prepared Using the Above Piezoelectric Composite Material Underwater acoustic transducers are constructed using two above described vibrator structures (one having the transition layer is connected by a plane layer, and another having transition layers independent of each other). Each of the underwater acoustic transducer structures, as shown in FIGS. 9A and 9B, includes a piezoelectric composite vibrator, a waterproof sound-permeable layer, and an underwater cable. A piezoelectric composite vibrator is composed of a piezoelectric ceramic that excites shear vibration and a vibration transition layer, and leads are connected to the output cable between the ceramic columns. The entire transducer is sealed with a waterproof sound-permeable layer, which can transmit sound and provide waterproof function. The waterproof sound-permeable layer can be made of polyurethane, rubber, or the like.

The present example includes three sets of transition layers and the sound waves are emitted on both sides. The invention structures, however, are not limited the above structures. In other embodiments, more sets of piezoelectric posts and transition layers may be employed depending on the different application requirements and the structural design requirements for the transducers. The transition layers can be connected as a whole or disconnected. In addition, it can be modified to enhance sound on a single side according to specific requirements.

Figure 11A:
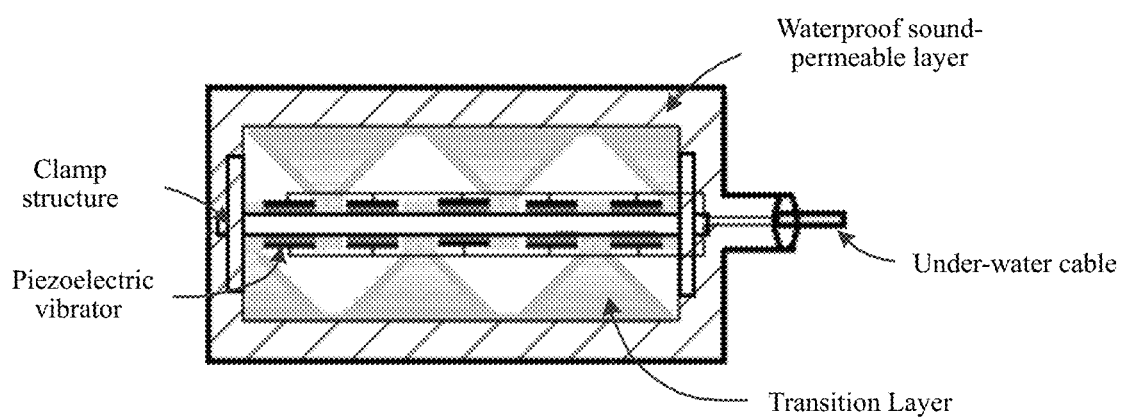
FIGS. 11A and 11B are diagrams respectively showing configurations of a hydrophones and a piezoelectric energy harvester made of a shear-vibration-based piezoelectric composite.
Figure 11B:
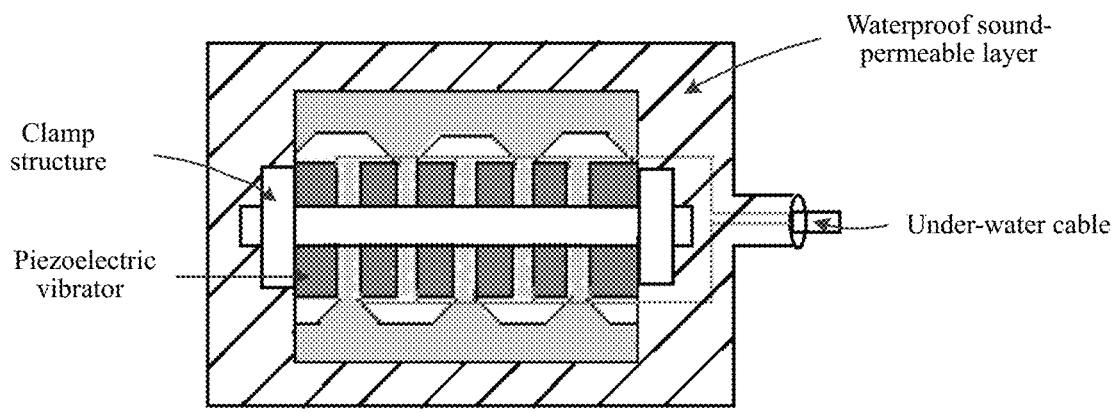

5. Hydrophone and Piezoelectric Energy Harvester Prepared Using the Above Piezoelectric Composite Material The shear-vibration-based piezoelectric composite materials prepared as described above can also be used to construct a hydrophone (i.e., a transducer receiving end) and a piezoelectric energy harvester. When stress is applied to the surface of the polymer, the stress is transferred to the ceramic block by the polymer column bonded between the ceramic blocks to cause shear deformation. The charge output is generated due to the piezoelectric effect. By adopting the transition layer structure, the stress on the surface of the polymer is actually transmitted to the ceramic block through the polymer columns bonded between the ceramics, and the stress is amplified, which in turn generates a large shear deformation and output and output larger amount of electrical energy, which enables applications as hydrophones and piezoelectric energy harvesters. Both the hydrophone and the piezoelectric energy absorbing device can be made of the two vibrator structures previously designed, similar to the transmitting transducer. As shown in FIGS. 11A and 11B, in order to increase the compressive tensile strength, a clamp structure is added. The clamping structure includes two metal sheets sandwiching on both sides of the piezoelectric vibrator along the x-axis, which is tightened with long screws to apply pre-stress along the x-axis.

Similar to the transmitting transducer, the number of ceramic blocks and the structures used in this example can be adjusted according to different application requirements. The invention is not limited to the specific structures, as long as the clamping structure performs its functions.

The above embodiments are only used to illustrate the technical solutions of the present invention, and the present invention is not limited thereto, and those skilled in the art can modify or replace the technical solutions of the present invention without departing from the spirit and scope of the present invention. The scope of protection shall be as stated in the claims.

What is claimed is:

1. A shear vibration-based piezoelectric composite, comprising:
a piezoelectric material; and
a passive material,
wherein the piezoelectric material comprises a first piezoelectric material polarized along a positive x-axis direction and a second piezoelectric material polarized along a negative x-axis direction, wherein polarization directions of the first piezoelectric material and the second piezoelectric material are alternately arranged along an x-axis direction,
wherein the passive material comprises a filling layer, a transition layer and a planar layer, wherein the filling layer is disposed between every two of the first piezoelectric material and the second piezoelectric material that are adjacent to each other,
wherein the planar layer is located outside two surfaces of the piezoelectric material that are perpendicular to z-axis, wherein one side of the planar layer is fixedly connected to the filling layer at odd-numbered positions through the transition layer, and another side of the planar layer is fixedly connected to the filling layer at even-numbered positions through the transition layer.

2. The shear vibration-based piezoelectric composite of claim 1, further comprising: electrodes disposed on the two surfaces of the piezoelectric material perpendicular to the z-axis.

3. The shear vibration-based piezoelectric composite of claim 1, wherein during operation, an angle between the polarization directions and direction of an electric field is 90 degrees,
wherein the piezoelectric material is configured to generate shear deformations in response to excitation of the electric field and to drive vibrations in the filling layer between the first piezoelectric material and the second piezoelectric material,
wherein vibrations in adjacent filling layers are in opposite directions,
wherein the vibrations in the adjacent filling layers are transmitted to the planar layer through the transition layer, which transforms shear vibrations in the piezoelectric material to thickness vibrations.

4. The shear vibration-based piezoelectric composite of claim 1, wherein the piezoelectric material includes a piezoelectric ceramic, a piezoelectric single crystal, a piezoelectric polymer, or a piezoelectric composite, wherein the passive material includes a polymer, a metal, or a ceramic, wherein the polymer includes an epoxy resin, a phenol resin, a polyurethane, a rubber, or a plexiglass.

5. The shear vibration-based piezoelectric composite of claim 1, wherein the transition layer has a trapezoidal, a rectangular, or a parabolic cross section, wherein the transition layer has a cylindrical or conical shape.

6. The shear vibration-based piezoelectric composite of claim 1, wherein transition layers on a same side of the piezoelectric material are independent of each other or are joined together by the planar layer.

7. The shear vibration-based piezoelectric composite of claim 1, further comprising: a pre-stressing structure configured to apply a pre-stress to the piezoelectric material along the x-axis direction to increase compressive and tensile strength.

8. The shear vibration-based piezoelectric composite of claim 1, further comprising: a hydro-acoustic transducer comprising a piezoelectric composite vibrator comprising the shear vibration-based piezoelectric composite; a waterproof sound-permeable layer; and an output cable, wherein the shear vibration-based piezoelectric composite is connected to the output cable through a lead wire, wherein the piezoelectric composite vibrator is sealed outside by the waterproof sound-permeable layer.

9. The shear vibration-based piezoelectric composite of claim 1, further comprising: an energy collecting device comprising a piezoelectric composite vibrator comprising the shear vibration-based piezoelectric composite; a clamp structure configured to increase compressive tensile strength; a waterproof sound-permeable layer; and an output cable, wherein the shear vibration-based piezoelectric composite is connected to the output cable by a lead wire, wherein the piezoelectric composite vibrator is sealed outside by the waterproof sound-permeable layer.

10. The energy collecting device of claim 9, wherein the energy collecting device is a hydrophone or a piezoelectric energy harvester.

11. The energy collecting device of claim 9, wherein the clamp structure includes two metal pieces that fixedly sandwich two sides of the piezoelectric composite vibrator along the x-axis direction to pre-stress the piezoelectric composite vibrator along the x-axis direction.

12. A method for preparing a shear vibration-based piezoelectric composite, comprising:
  1) cutting a piezoelectric material into a plurality of blocks arranged in an array;
  2) sputtering electrodes on two opposite surfaces of each of the plurality of blocks of the piezoelectric material, wherein the plurality of blocks comprise a first piezoelectric material polarized along a positive x-axis direction and a second piezoelectric material polarized along a negative x-axis direction, wherein polarization directions of the first piezoelectric material and the second piezoelectric material are alternately arranged along an x-axis direction;
  3) forming a filling layer, a transition layer, and a planar layer by machining; and
  4) bonding the filling layer, the transition layer, and the planar layer to the plurality of blocks of the piezoelectric material, wherein the filling layer is disposed between every two of the plurality of blocks that are adjacent to each other; and welding wire to electrodes to form a piezoelectric composite material.

13. A method for preparing a shear vibration-based piezoelectric composite, comprising:
  1) pasting a mask material on a first surface of a piezoelectric material;
  2) cutting the piezoelectric material in a direction perpendicular to the first surface to form a plurality of blocks arranged in an array;
  3) sputtering electrodes on the first surface and cut surfaces of each of the plurality of blocks, wherein the plurality of blocks comprise a first piezoelectric material polarized along a positive x-axis direction and a second piezoelectric material polarized along a negative x-axis direction, wherein polarization directions of the first piezoelectric material and the second piezoelectric material are alternately arranged along an x-axis direction;
  4) building a mold according to shapes of a filling layer, a transition layer, and a planar layer; and placing the mold next to each of the plurality of blocks;
  5) injecting a polymer material with the mold and curing to form the filling layer, the transition layer, and the planar layer made of the polymer material on a side of the first surface of the piezoelectric material;
  6) repeating steps 1) to 5) on a second surface of the piezoelectric material opposite to the first surface to form the filling layer, the transition layer, and the planar layer on a side of the second surface of the piezoelectric material, wherein the filling layer is disposed between every two of the plurality of blocks that are adjacent to each other; and
  7) removing mold and mask materials by temperature shock method to form a piezoelectric composite material.

* * * * *